(12) United States Patent
Gao et al.

(10) Patent No.: US 12,447,712 B2
(45) Date of Patent: Oct. 21, 2025

(54) BEARING SUBSTRATE, BINDING ASSEMBLY AND BINDING METHOD THEREOF

(71) Applicant: BOE TECHNOLOGY GROUP CO., LTD., Beijing (CN)

(72) Inventors: Zhan Gao, Beijing (CN); Xing Zhang, Beijing (CN); Pan Xu, Beijing (CN); Wei Liu, Beijing (CN); Ying Han, Beijing (CN); Guoying Wang, Beijing (CN); Yicheng Lin, Beijing (CN); Tangxiang Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 872 days.

(21) Appl. No.: 17/630,670

(22) PCT Filed: Jan. 25, 2021

(86) PCT No.: PCT/CN2021/073643
§ 371 (c)(1),
(2) Date: Jan. 27, 2022

(87) PCT Pub. No.: WO2022/155965
PCT Pub. Date: Jul. 28, 2022

(65) Prior Publication Data
US 2023/0158769 A1 May 25, 2023

(51) Int. Cl.
*B32B 3/08* (2006.01)
*B32B 7/027* (2019.01)

(52) U.S. Cl.
CPC ............ *B32B 3/08* (2013.01); *B32B 7/027* (2019.01); *B32B 2457/08* (2013.01); *B32B 2457/20* (2013.01)

(58) Field of Classification Search
CPC ... Y10T 428/24942; G02F 1/13; G02F 1/133; G02F 1/333; G02F 1/345; H05K 1/11;
(Continued)

(56) References Cited

U.S. PATENT DOCUMENTS

| 9,893,032 B2 | 2/2018 | Park | |
|---|---|---|---|
| 2013/0306360 A1* | 11/2013 | Tan | H05K 1/189 |
| | | | 29/829 |

(Continued)

FOREIGN PATENT DOCUMENTS

| CN | 101488432 A | 7/2009 |
|---|---|---|
| CN | 101847590 A | 9/2010 |

(Continued)

OTHER PUBLICATIONS

Machine translation (Espacenet) of CN 107809843 A. Translated Nov. 12, 2024. (Year: 2024).*

(Continued)

*Primary Examiner* — Maria V Ewald
*Assistant Examiner* — Ethan A. Utt
(74) *Attorney, Agent, or Firm* — Perilla Knox & Hildebrandt LLP; Kenneth A. Knox (57) ABSTRACT

The present disclosure relates to the technical field of display, and provides a bearing substrate, a binding assembly, and a binding method thereof. The bearing substrate may be bound to an integrated substrate. A thermal expansion coefficient of the bearing substrate is greater than a thermal expansion coefficient of the integrated substrate. The integrated substrate includes a plurality of second binding terminals distributed at equal intervals in a same direction. The bearing substrate includes a plurality of first binding terminal sets distributed at equal intervals in a first direction, and each of the first binding terminal sets includes a plurality of first binding terminals distributed at equal (Continued)

intervals in the first direction for binding with the plurality of the second binding terminals one-to-one.

17 Claims, 6 Drawing Sheets

(58) Field of Classification Search
CPC ........ H05K 1/111; H05K 1/117; H05K 1/118; H05K 1/14; H05K 2201/09; H05K 2201/09209; H05K 2201/09372; H05K 2201/09427
USPC .................................................. 428/33, 212
See application file for complete search history.

(56) References Cited

U.S. PATENT DOCUMENTS

| | | |
|---|---|---|
| 2016/0225736 A1 | 8/2016 | Park |
| 2018/0122769 A1 | 5/2018 | Park |
| 2020/0210041 A1 | 7/2020 | Liu |

FOREIGN PATENT DOCUMENTS

| | | | | |
|---|---|---|---|---|
| CN | 101847590 B | 1/2013 | | |
| CN | 104297966 A | 1/2015 | | |
| CN | 105720028 A | 6/2016 | | |
| CN | 206039090 U | 3/2017 | | |
| CN | 107809843 A | * 3/2018 | ............. | H05K 1/116 |
| CN | 108718481 A | 10/2018 | | |
| CN | 108957878 A | 12/2018 | | |
| CN | 109445649 A | 3/2019 | | |
| CN | 109451660 A | 3/2019 | | |
| CN | 107809843 B | 12/2019 | | |
| CN | 110708868 A | 1/2020 | | |
| CN | 111009501 A | 4/2020 | | |
| CN | 111048574 A | 4/2020 | | |
| CN | 111145643 A | 5/2020 | | |
| CN | 108718481 B | 6/2020 | | |
| CN | 112014988 A | 12/2020 | | |
| CN | 112071200 A | 12/2020 | | |

OTHER PUBLICATIONS

Written Opinion for International Application No. PCT/CN2021/073643 mailed Oct. 28, 2021.

* cited by examiner

BEARING SUBSTRATE, BINDING ASSEMBLY AND BINDING METHOD THEREOF

CROSS-REFERENCE TO RELATED APPLICATION

The present disclosure is a national phase application under 35 U.S.C. § 371 of International Application No. PCT/CN2021/073643 filed Jan. 25, 2021, the contents of which being incorporated by reference in their entirety herein.

TECHNICAL FIELD

The present disclosure relates to the technical field of display and, in particular to a bearing substrate, a binding assembly, and a binding method thereof.

BACKGROUND

In the related art, substrates, such as those employed in display panel technology, are usually bound with binding terminals by way of thermal pressing technology. At that time, when thermal expansion coefficients of two substrates to be bound are different, binding terminals will be misaligned. For example, in a binding technology of a display panel, the display panel needs to be bound with an on-chip film. However, since the thermal expansion coefficient of the display panel is greater than that of the on-chip film, the binding effect of the binding terminals on the display panel and the binding terminals on the on-chip film is poor.

It should be noted that information disclosed in this part are provided only for acquiring a better understanding of the background of the present application and therefore may include information that is not current technology already known to those of ordinary skill in the art.

SUMMARY

According to one aspect of the present disclosure, a bearing substrate is provided. The bearing substrate may be bound to an integrated substrate. A thermal expansion coefficient of the bearing substrate is greater than a thermal expansion coefficient of the integrated substrate. The integrated substrate includes a plurality of second binding terminals distributed at equal intervals in the same direction. The bearing substrate includes a plurality of first binding terminal sets distributed at equal intervals in a first direction, and each of the first binding terminal sets includes a plurality of first binding terminals distributed at equal intervals in the first direction for binding with the plurality of the second binding terminals one-to-one. A distance between adjacent two of the first binding terminal sets is smaller than a distance between adjacent two of the first binding terminals in each of the first binding terminal sets, and the distance between adjacent two of the first binding terminals in each of the first binding terminal sets is equal to a distance between adjacent two of the second binding terminals.

In an exemplary embodiment of the present disclosure, each of the first binding terminal sets includes n first binding terminals, where n is a positive integer greater than 1; and $S1$ is the distance between adjacent two of the first binding terminal sets, $S2$ is the distance between adjacent two of the first binding terminals in each of the first binding terminal sets, a is the thermal expansion coefficient of the bearing substrate, W is a size of the first binding terminal in the first direction, and $S1=S2-a*n*(S2+W)$.

In an exemplary embodiment of the present disclosure, a value of n is 5-35.

In an exemplary embodiment of the present disclosure, the second binding terminal is in an elongated strip shape, and an arrangement direction of the second binding terminals is perpendicular to extending directions of the second binding terminals; and the first binding terminal is in an elongated strip shape, and an arrangement direction of the first binding terminals is perpendicular to extending directions of the first binding terminals.

In an exemplary embodiment of the present disclosure, the first binding terminal is in an elongated strip shape, a straight line where an extending direction of the first binding terminal is located forms a first acute angle with respect to a straight line in the first direction, and a value of the first acute angle is 69°-85°; and the second binding terminal is in an elongated strip shape, a straight line where an extending direction of the second binding terminal is located forms a second acute angle with respect to a straight line where a distribution direction of the second binding terminals is located, and the second acute angle and the first acute angle have the same value.

In an exemplary embodiment of the present disclosure, the bearing substrate is a flexible display panel, and the integrated substrate is an on-chip film.

According to one aspect of the present disclosure, a bearing substrate is provided. The bearing substrate includes a plurality of first binding terminal sets distributed at equal intervals in a first direction, and each of the first binding terminal sets comprises a plurality of first binding terminals distributed at equal intervals in the first direction. A distance between adjacent two of the first binding terminal sets is smaller than a distance between adjacent two of the first binding terminals in each of the first binding terminal sets.

In an exemplary embodiment of the present disclosure, each of the first binding terminal sets includes n first binding terminals, where n is a positive integer greater than 1; $S1$ is the distance between adjacent two of the first binding terminal sets, $S2$ is the distance between adjacent two of the first binding terminals in each of the first binding terminal sets, a is the thermal expansion coefficient of the bearing substrate, W is a size of the first binding terminal in the first direction, and $S1=S2-a*n*(S2+W)$.

In an exemplary embodiment of the present disclosure, a value of n is 5-35.

In an exemplary embodiment of the present disclosure, the first binding terminal is in an elongated strip shape, and an arrangement direction of the first binding terminals is perpendicular to extending directions of the first binding terminals.

In an exemplary embodiment of the present disclosure, the bearing substrate is a flexible display panel.

According to one aspect of the present disclosure, a binding assembly is provided. The binding assembly includes a bearing substrate and an integrated substrate. The bearing substrate includes a plurality of first binding terminal sets distributed at equal intervals in a first direction, and each of the first binding terminal sets includes a plurality of first binding terminals distributed at equal intervals in the first direction. A distance between adjacent two of the first binding terminal sets is smaller than a distance between adjacent two of the first binding terminals in each of the first binding terminal sets. A thermal expansion coefficient of the integrated substrate is smaller than a thermal expansion coefficient of the bearing substrate. The integrated substrate includes a plurality of second binding terminals for binding with the plurality of first binding terminals one-to-one, and the plurality of second binding terminals are distributed at equal intervals in the first direction.

In an exemplary embodiment of the present disclosure, each of the first binding terminal sets includes n first binding terminals, and the value of n is 5-35.

In an exemplary embodiment of the present disclosure, the second binding terminal is in an elongated strip shape, and an arrangement direction of the second binding terminals is perpendicular to extending directions of the second binding terminals; and the first binding terminal is in an elongated strip shape, and an arrangement direction of the first binding terminals is perpendicular to extending directions of the first binding terminals.

In an exemplary embodiment of the present disclosure, the first binding terminal is in an elongated strip shape, a straight line where an extending direction of the first binding terminal is located forms a first acute angle with respect to a straight line in the first direction, and a value of the first acute angle is 69°-85°; and the second binding terminal is in an elongated strip shape, a straight line where an extending direction of the second binding terminal is located forms a second acute angle with respect to a straight line in the first direction, and the second acute angle and the first acute angle have the same value.

In an exemplary embodiment of the present disclosure, the binding assembly is a display device, the bearing substrate is a flexible display panel, and the integrated substrate is an on-chip film.

According to one aspect of the present disclosure, a binding method of a binding assembly is provided. The binding method includes:

providing a bearing substrate and an integrated substrate, wherein a thermal expansion coefficient of the integrated substrate is smaller than a thermal expansion coefficient of the bearing substrate;

wherein the bearing substrate includes a plurality of first binding terminal sets distributed at equal intervals in the same direction, each of the first binding terminal sets includes a plurality of first binding terminals, a distribution direction of the first binding terminals is the same as a distribution direction of the first binding terminal sets, and a distance between adjacent two of the first binding terminal sets is smaller than a distance between adjacent two of the first binding terminals in each of the first binding terminal sets;

the integrated substrate includes a plurality of second binding terminals distributed at equal intervals in the same direction for binding with the first binding terminals one-to-one, and the distance between adjacent two of the first binding terminals in each of the first binding terminal sets is equal to a distance between adjacent two of the second binding terminals;

aligning and heating the bearing substrate and the integrated substrate;

pressing the bearing substrate and the integrated substrate.

In an exemplary embodiment of the present disclosure, each of the first binding terminal sets includes n first binding terminals, where n is a positive integer greater than 1; and S1 is the distance between adjacent two of the first binding terminal sets, S2 is the distance between adjacent two of the first binding terminals in each of the first binding terminal sets, a is the thermal expansion coefficient of the bearing substrate, W is a size of the first binding terminal in the distribution direction thereof, and $S1 \times S2 = a \times n \times (S2+W)$.

In an exemplary embodiment of the present disclosure, each of the first binding terminal sets includes n first binding terminals, and a value of n is 5-35.

In an exemplary embodiment of the present disclosure, the second binding terminal is in an elongated strip shape, and an arrangement direction of the second binding terminals is perpendicular to extending directions of the second binding terminals; and the first binding terminal is in an elongated strip shape, and an arrangement direction of the first binding terminals is perpendicular to extending directions of the first binding terminals.

In an exemplary embodiment of the present disclosure, the first binding terminal is in an elongated strip shape, a straight line where an extending direction of the first binding terminal is located forms a first acute angle with respect to a straight line in the first direction, and a value of the first acute angle is 69°-85°; and the second binding terminal is in an elongated strip shape, a straight line where an extending direction of the second binding terminal is located forms a second acute angle with respect to a straight line in the first direction, and the second acute angle and the first acute angle have the same value.

In an exemplary embodiment of the present disclosure, the binding assembly is a display device, the bearing substrate is a flexible display panel, and the integrated substrate is an on-chip film.

It shall be understood that the above general description and the following detailed description are merely exemplary and explanatory and are not intended to be restrictive of the present disclosure.

BRIEF DESCRIPTION OF THE DRAWINGS

The accompanying drawings, which are incorporated in and constitute a part of this specification, illustrate embodiments consistent with the invention and, together with the description, serve to explain the principles of the invention. It should be understood that the drawings in the following description are merely examples of this disclosure, and that other drawings may be obtained by those ordinary skilled in the art without creative work.

DETAILED DESCRIPTION

Exemplary embodiments will now be described more fully by reference to the accompanying drawings. However, the exemplary embodiments can be implemented in various forms and should not be understood as being limited to the examples set forth herein; rather, the embodiments are provided so that this disclosure will be thorough and complete, and the conception of exemplary embodiments will be fully conveyed to those skilled in the art. The same reference signs in the drawings denote the same or similar structures and detailed description thereof will be omitted.

Although terms having opposite meanings such as "up" and "down" are used herein to describe the relationship of one component relative to another component, such terms are used herein only for the sake of convenience, for example, "in the direction illustrated in the figure". It can be understood that if a device denoted in the drawings is turned upside down, a component described as "above" something will become a component described as "under" something. Other relative terms, such as "high", "low", "top", "bottom", "left", and "right" have similar meanings. When a structure is described as "above" another structure, it may mean that the structure is integrally formed on another structure, or, the structure is "directly" disposed on another structure, or, the structure is "indirectly" disposed on another structure through an additional structure.

Words such as "one", "an/a", "the", and "said" are used herein to indicate the presence of one or more elements/component parts/and others. Terms "including", and "having" have an inclusive meaning such that there may be additional elements/component parts/and others in addition to the listed elements/component parts/and others.

Figure 1:
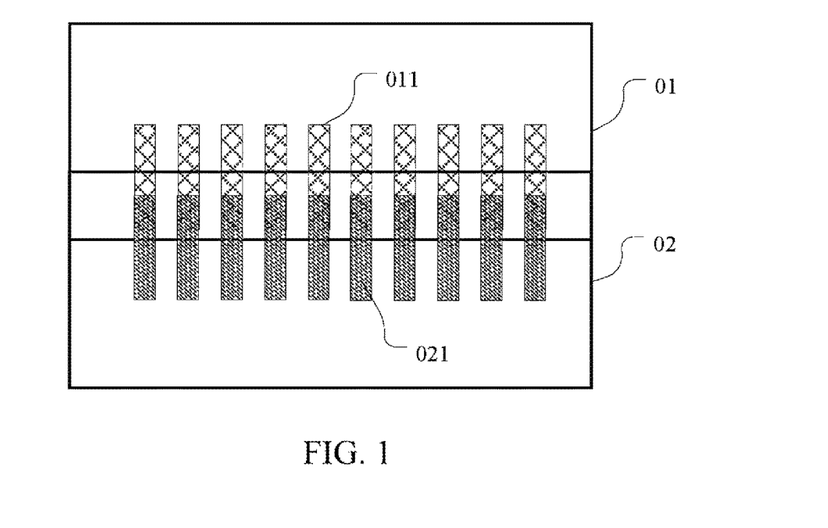
FIG. 1 is a structural schematic view of two substrates to be bound before heating in the related art.
Figure 2:
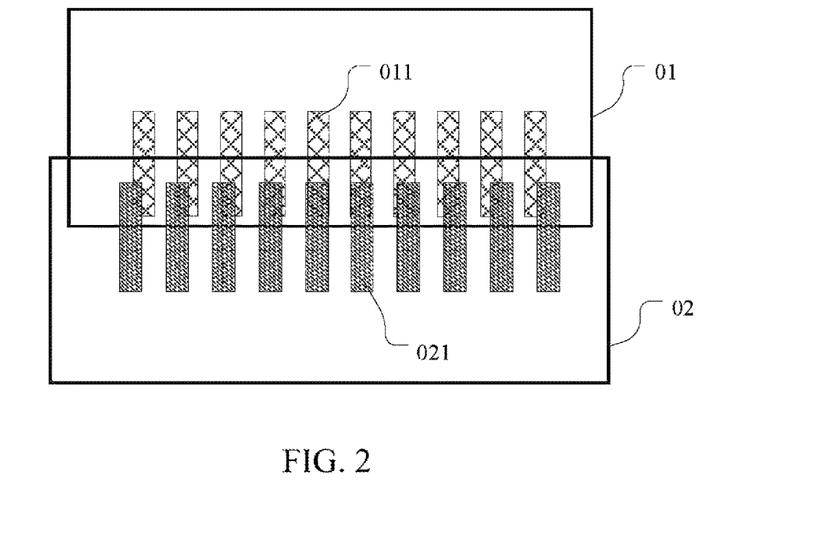
FIG. 2 is a structural schematic view of two substrates to be bound after heating in the related art.

In the related art, substrates to be bound are usually bound with binding terminals by way of thermal pressing technology. FIG. 1 is a structural schematic view of two substrates to be bound before heating in the related art, where the two substrates to be bound each includes a to-be-bound substrate (also referred to as "a substrate to be bound") 01 and a to-be-bound substrate 02. The to-be-bound substrate 01 includes a plurality of binding terminals 011 and the to-be-bound substrate 02 includes a plurality of binding terminals 021. In the related art, a size of a gap between the binding terminals 011 is equal to a size of a gap between the binding terminals 021, and a size of the binding terminals 011 in an arrangement direction thereof is equal to a size of the binding terminals 021 in an arrangement direction thereof. FIG. 2 is a structural schematic view of two substrates to be bound after heating in the related art. Since a thermal expansion coefficient of the to-be-bound substrate 01 is smaller than a thermal expansion coefficient of the to-be-bound substrate 02, during a thermal pressing process of the to-be-bound substrate 01 and the to-be-bound substrate 02, the binding terminal 011 and the binding terminal 021 are at least partly offset in position, thereby reducing an overlapping area of the binding terminal 011 and the binding terminal 021, increasing a resistance between the binding terminal 011 and the binding terminal 021, and reducing a signal transmission effect.

Based on this, this exemplary embodiment provides a binding method of a binding assembly, and the binding method of the binding assembly includes:

Step S1, providing a bearing substrate and an integrated substrate, where a thermal expansion coefficient of the integrated substrate is smaller than a thermal expansion coefficient of the bearing substrate.

Figure 3:
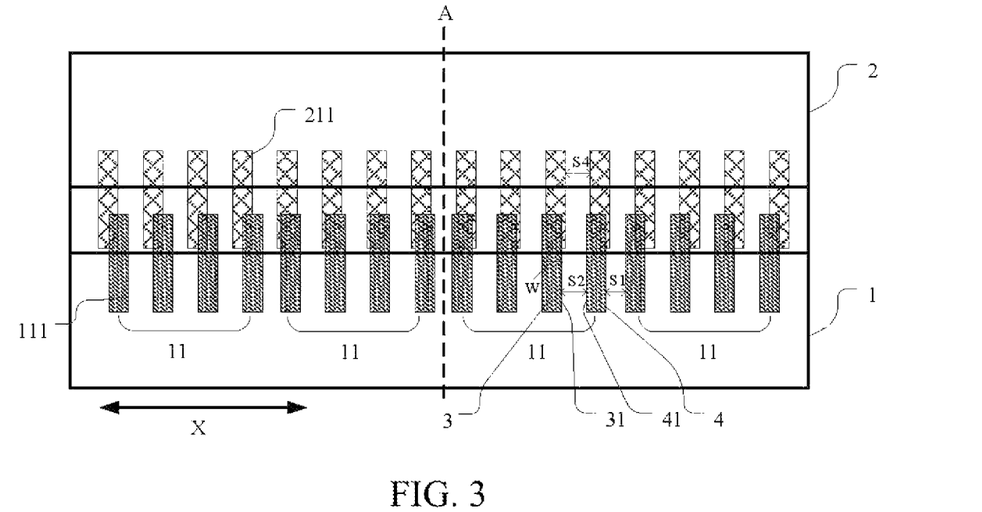
FIG. 3 is a structural schematic view of a bearing substrate and an integrated substrate before heating according to an exemplary embodiment of a binding method of a binding assembly of the present disclosure.

FIG. 3 is a structural schematic view of a bearing substrate and an integrated substrate before heating according to an exemplary embodiment of the binding method of the binding assembly of the present disclosure, and shows a structural schematic view of the bearing substrate 1 and the integrated substrate 2 after alignment. The bearing substrate 1 may include a plurality of first binding terminal sets 11. The plurality of first binding terminal sets 11 may be distributed at equal intervals in a first direction X, each of the first binding terminal sets 11 may include a plurality of first binding terminals 111 distributed at equal intervals in the first direction X, and a distance S2 may exist between adjacent two first binding terminals in each of the first binding terminal sets 11. A distance S1 between adjacent two first binding terminal sets 11 is smaller than the distance S2 between adjacent two first binding terminals 111 in the first binding terminal set 11. The integrated substrate 2 may include a plurality of second binding terminals 211, and the plurality of second binding terminals 211 are configured to bind with the plurality of first binding terminals 111 one-to-one. After the bearing substrate 1 and the integrated substrate 2 are aligned, the plurality of second binding terminals 211 may also be distributed at equal intervals in the first direction X, and the distance S2 between adjacent two first binding terminals 111 in the first binding terminal set 11 may be equal to a distance S4 between adjacent two second binding terminals 211. As shown in FIG. 3, adjacent two first binding terminals 111 may include a first binding sub-terminal 3 and a second binding sub-terminal 4 that are adjacent to each other. The first binding sub-terminal 3 includes a side edge 31 facing the second binding sub-terminal 4, the second binding sub-terminal 4 includes a side edge 41 facing the first binding sub-terminal 3, and the side edge 31 and the side edge 41 may be parallel. The distance S2 between adjacent two first binding terminals 111 in the first binding terminal set 11 may refer to a distance between the side edge 41 and the side edge 31 in the first direction X. Similarly, the distance S4 between adjacent two second binding terminals 211 may refer to a distance in the first direction X between adjacent two side edges of adjacent two second binding terminals 211. The distance S1 between adjacent two first binding terminal sets 11 may refer to a distance between adjacent two first binding terminals in adjacent two first binding terminal sets 11. As shown in FIG. 3, the plurality of first binding terminals 111 may be symmetrical with respect to a symmetry axis A, and at the same time, the plurality of second binding terminals 211 may also be symmetrical with respect to the symmetry axis A, wherein the symmetry axis A may be perpendicular to the first direction. Since the distance between adjacent first binding terminal sets 11 is compressed in the present exemplary embodiment, the first binding terminal 111 will be misaligned relative to the second binding terminal 211 in a direction approaching the symmetry axis A.

Figure 4:
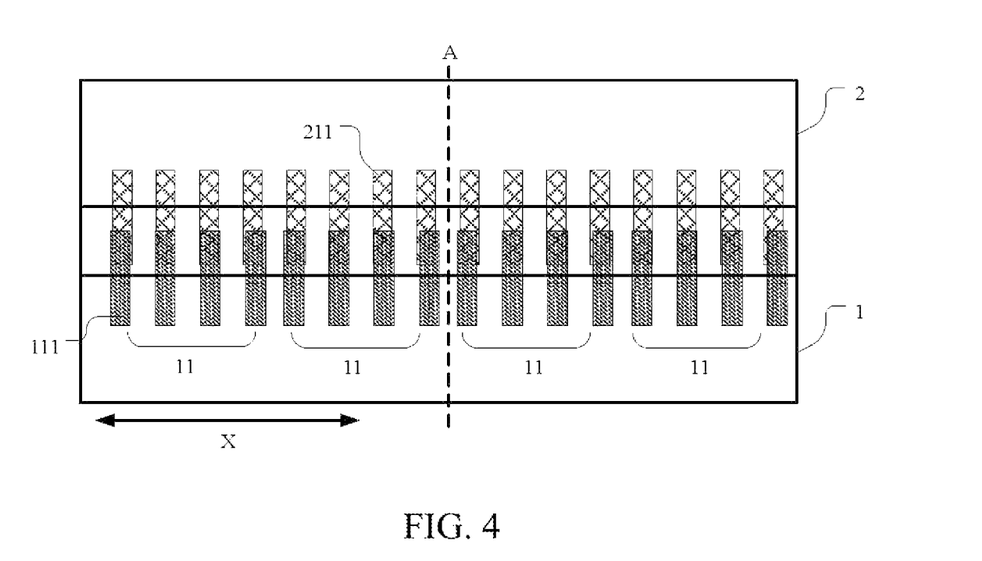
FIG. 4 is a structural schematic view of a bearing substrate and an integrated substrate after heating according to an exemplary embodiment of a binding method of a binding assembly of the present disclosure.

The fabrication method includes step S2, aligning and heating the bearing substrate 1 and the integrated substrate 2. FIG. 4 is a structural schematic view of the bearing substrate and the integrated substrate after heating according to an exemplary embodiment of the binding method of the binding assembly of the present disclosure. The step of heating the bearing substrate 1 and the integrated substrate 2 may include heating an area of the bearing substrate 1 where the first binding terminal 111 is located and an area of the integrated substrate 2 where the second binding terminal 211 is located. After heating, the distance S2 between adjacent two first binding terminals 111 in the first binding terminal set 11 will be increased, the distance S1 between the first binding terminal sets 11 will be increased, and the distance S4 between the second binding terminal sets will be increased. Since the thermal expansion coefficient of the bearing substrate 1 is greater than the thermal expansion coefficient of the integrated substrate, the increased distance S2 will be greater than the increased distance S4, and the increased distance S1 will be closer to the increased distance S4, that is, a difference between the increased distance S4 and the increased distance S1 is smaller than a difference between the distance S4 before increased and the distance S1 before increased. Therefore, the heated first binding terminal 111 will be misaligned relative to the second binding terminal 211 in a direction away from the symmetry axis A, thereby obtaining a better alignment of the first binding terminal(s) 111 and the second binding terminal(s) 211.

The fabrication method includes step S3, pressing the bearing substrate 1 and the integrated substrate 2 to bind the first binding terminal(s) 111 and the second binding terminal (s) 211.

In this exemplary embodiment, the first binding terminals are divided into a plurality of sets, and the distance between the first binding terminal sets are pre-compressed, thereby increasing an overlapping area of the first binding terminal (s) and the second binding terminal(s) after the bearing substrate and the integrated substrate are heated, and improving the binding effect.

In the related art, the distance between every adjacent two first binding terminals may also be compressed. However, since the amount of pre-compression between adjacent first binding terminals is relatively small, when the distance between every adjacent first binding terminals is compressed, a higher-precision processing device is required.

In this exemplary embodiment, each of the first binding terminal sets may include four first binding terminals. The thermal expansion coefficient of the bearing substrate may be a, and a size of the first binding terminal in the first direction is W, then S1 may be equal to S2−a*4*(S2+W). It should be understood, when the first binding terminal set includes n first binding terminals, and n is a positive integer greater than 1, then S1 may be equal to S2−n*a*(S2+W). It should be noted, in this exemplary embodiment, the distance between the first binding terminal sets is compressed only according to the thermal expansion coefficient of the bearing substrate. In other embodiments of the present disclosure, the distance between the first binding terminal sets may be compressed in consideration with the thermal expansion coefficients of the bearing substrate and the integrated substrate at the same time. When the thermal expansion coefficients of the bearing substrate and the integrated substrate are considered at the same time, S1 may be equal to S2−(a−b)*n*(S2+W), wherein b is the thermal expansion coefficient of the integrated substrate.

In this exemplary embodiment, the first binding terminals are divided into a plurality of sets, a pre-expansion amount of the bearing substrate in an area where a single first binding terminal set is located may be pre-compressed between the first binding terminal sets, and the amount of compression required between the first binding terminal sets is understandably greater than the amount of compression required between the first binding terminals in the related art. Therefore, the binding method provided by this exemplary embodiment can realize pre-compensation for the thermal expansion of the bearing substrate through a processing device with lower precision.

In this exemplary embodiment, before the bearing substrate and the integrated substrate are heated, the sizes of the first binding terminals in the first direction may be equal, the sizes of the second binding terminals in the first direction may be equal, and the size of the first binding terminal in the first direction may be equal to the size of the second binding terminal in the first direction. The second binding terminal may be in an elongated strip shape, and an arrangement direction of the second binding terminals may be perpendicular to extending directions of the second binding terminals. The first binding terminal may be in an elongated strip shape, and an arrangement direction of the first binding terminals may be perpendicular to extending directions of the first binding terminals.

In this exemplary embodiment, as shown in FIGS. 3 and 4, the first binding terminals and the second binding terminals may be rectangular. Each of the first binding terminal sets may include 4 first binding terminals, and a symmetry axis A may be located between adjacent two first binding terminal sets. It should be understood that, in other exemplary embodiments, the first binding terminals and the second binding terminals may also have other shapes. For example, each of the first binding terminals and the second binding terminals may be shaped as a parallelogram or a right-angled trapezoid, etc. Each of the first binding terminal sets may further include other numbers of first binding terminals, and the numbers of first binding terminals in the first binding terminal sets may be same or different. The symmetry axis A may also be located at other positions. For example, the symmetry axis A may be located on the area where the first binding terminal sets are located.

In this exemplary embodiment, each of the first binding terminal sets may include n first binding terminals, wherein the larger the value of n is, the lower the requirement on the process accuracy of the bearing substrate in the binding method is. At the same time, the distance between the first binding terminals in the first binding terminal set is not compressed, therefore, after the bearing substrate thermally expands, the misalignment will occur between at least a part of the first binding terminals in the same first binding terminal set and their corresponding second binding terminals. The larger the value of n is, the greater the maximum misalignment value of the first binding terminal in the same first binding terminal set is. In this exemplary embodiment, n may be 5-30, for example, n may be 5, 10, 15, 20, 25, 30.

Figure 5:
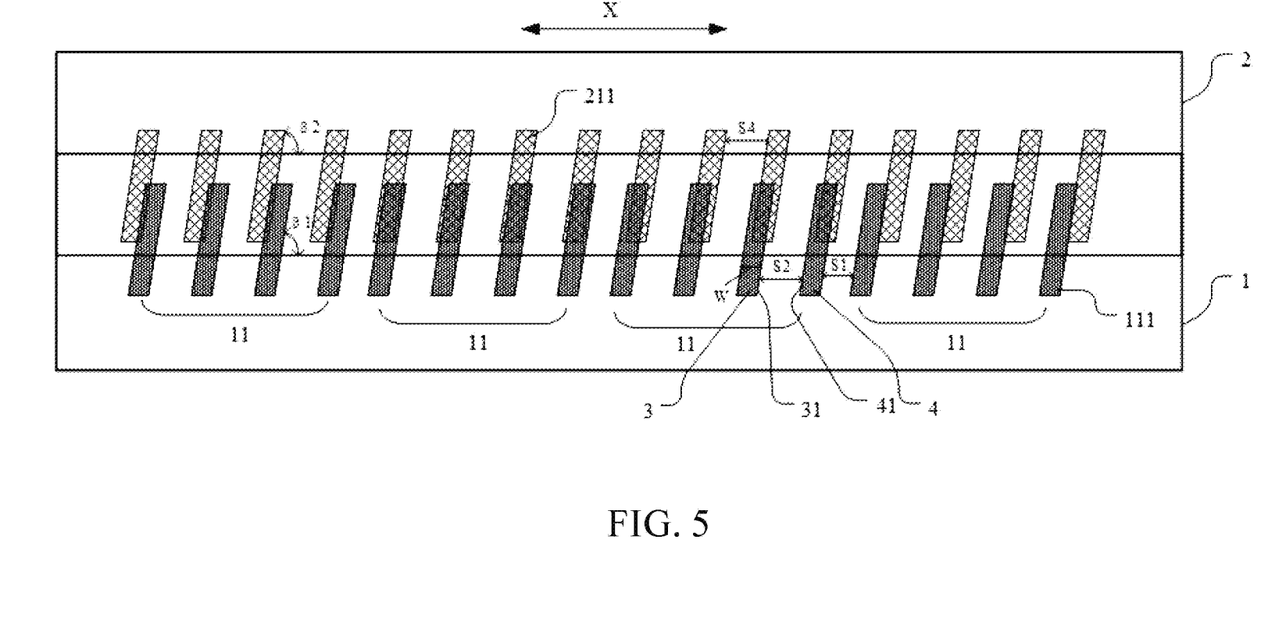
FIG. 5 is a structural schematic view of a bearing substrate and an integrated substrate before heating according to another exemplary embodiment of a binding method of a binding assembly of the present disclosure.

In this exemplary embodiment, as shown in FIG. 5, it is a structural schematic view of a bearing substrate and an integrated substrate before heating according to another exemplary embodiment of a binding method of a binding assembly of the present disclosure. The bearing substrate and the integrated substrate shown in FIG. 5 are different from the bearing substrate and the integrated substrate shown in FIG. 3 in that a straight line where an extending direction of the first binding terminal 111 is located may form a first acute angle β1 with respect to the first direction (that is, the distribution direction of the first binding terminals); a straight line where an extending direction of the second binding terminal 211 is located may form a second acute angle β2 with respect to the first direction X. A value of the first acute angle β1 may be 69°-85°, for example, the value of the first acute angle β1 may be 69°, 75°, or 85°, and the value of the first acute angle β1 may be equal to a value of the second acute angle. Each of the first binding terminal 111 and the second binding terminal 211 may be in a parallelogram. Similarly, the distance S1 between adjacent two first binding terminal sets 11 may be equal to $S2-n*a*(S2+W)$, where S2 is a distance between adjacent two first binding terminals in the first binding terminal set 11, n is the number of the first binding terminals in the first binding terminal set 11, a is the thermal expansion coefficient of the bearing substrate, and W is the size of the first binding terminal in the distribution direction. The distance S2 between adjacent two first binding terminals 111 in the first binding terminal set 11 may be equal to the distance S4 between adjacent two second binding terminals 211.

As shown in FIG. 5, the adjacent two first binding terminals 111 may include a first binding sub-terminal 3 and a second binding sub-terminal 4. The first binding sub-terminal 3 includes a side edge 31 facing the second binding sub-terminal 4, and the second binding sub-terminal 4 includes a side edge 41 facing the first binding sub-terminal 3. The side 31 edge and the side edge 41 may be parallel, and the extending direction of the first binding terminal 111 may refer to an extending direction of the side edge 31. Similarly, the extending direction of the second binding terminal 211 may refer to an extending direction of a side edge of the second binding terminal crossing the first direction X (that is, the distribution direction of the second binding terminals). The distance S2 between adjacent two first binding terminals 111 in the first binding terminal set 11 may refer to a distance between the side edge 41 and the side edge 31 in the first direction X. The distance S4 between adjacent two second binding terminals 211 may refer to a distance between adjacent two side edges of the adjacent two second binding terminals 211 in the first direction X. The distance S1 between the adjacent two first binding terminal sets 11 may refer to a distance between adjacent two first binding terminals in the adjacent two first binding terminal sets 11. As shown in FIG. 5, since the distance between the adjacent first binding terminal sets 11 is compressed in the exemplary embodiment, the first binding terminal 111 may be misaligned with respect to the second binding terminal 211.

Figure 6:
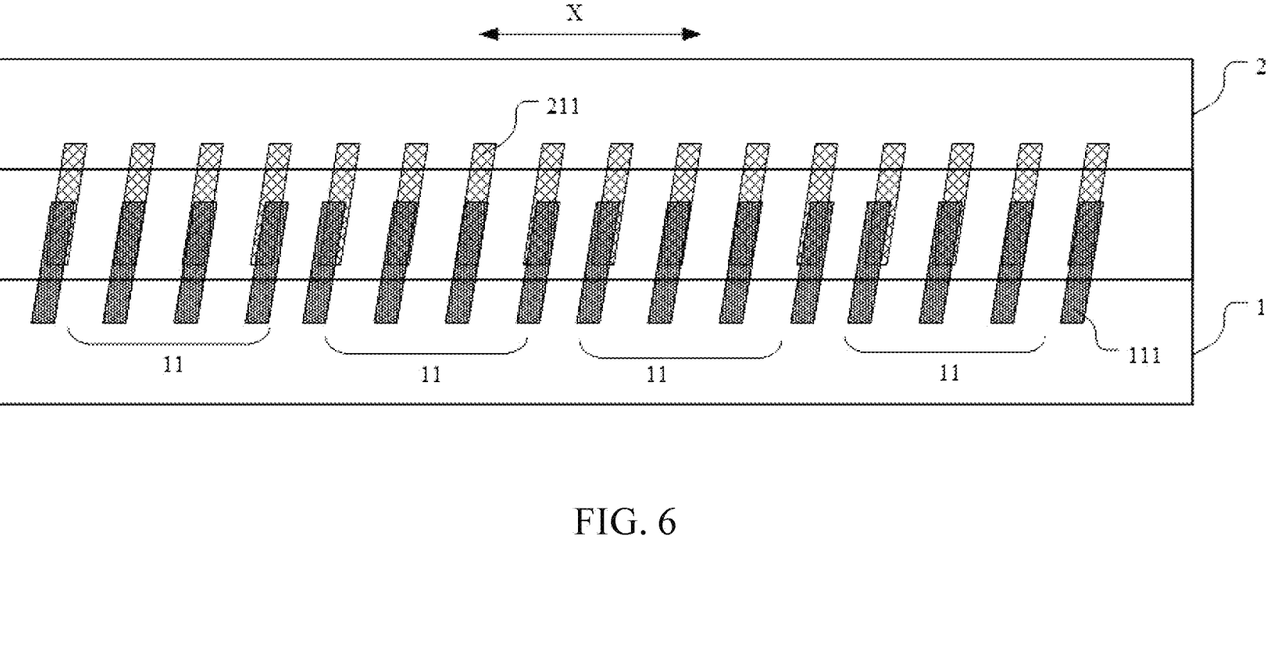
FIG. 6 is a structural schematic view of a bearing substrate and an integrated substrate after heating according to another exemplary embodiment of a binding method of a binding assembly of the present disclosure.

As shown in FIG. 6, it is a structural schematic view of a bearing substrate and an integrated substrate after heating according to another exemplary embodiment of a binding method of a binding assembly of the present disclosure. Since the thermal expansion coefficient of the bearing substrate 1 is greater than the thermal expansion coefficient of the integrated substrate 2, the thermal expansion amount of the bearing substrate 1 after heating is greater than the thermal expansion amount of the integrated substrate 2, thereby achieving better alignment of the first binding terminals 111 and the second binding terminals 211.

Figure 7:
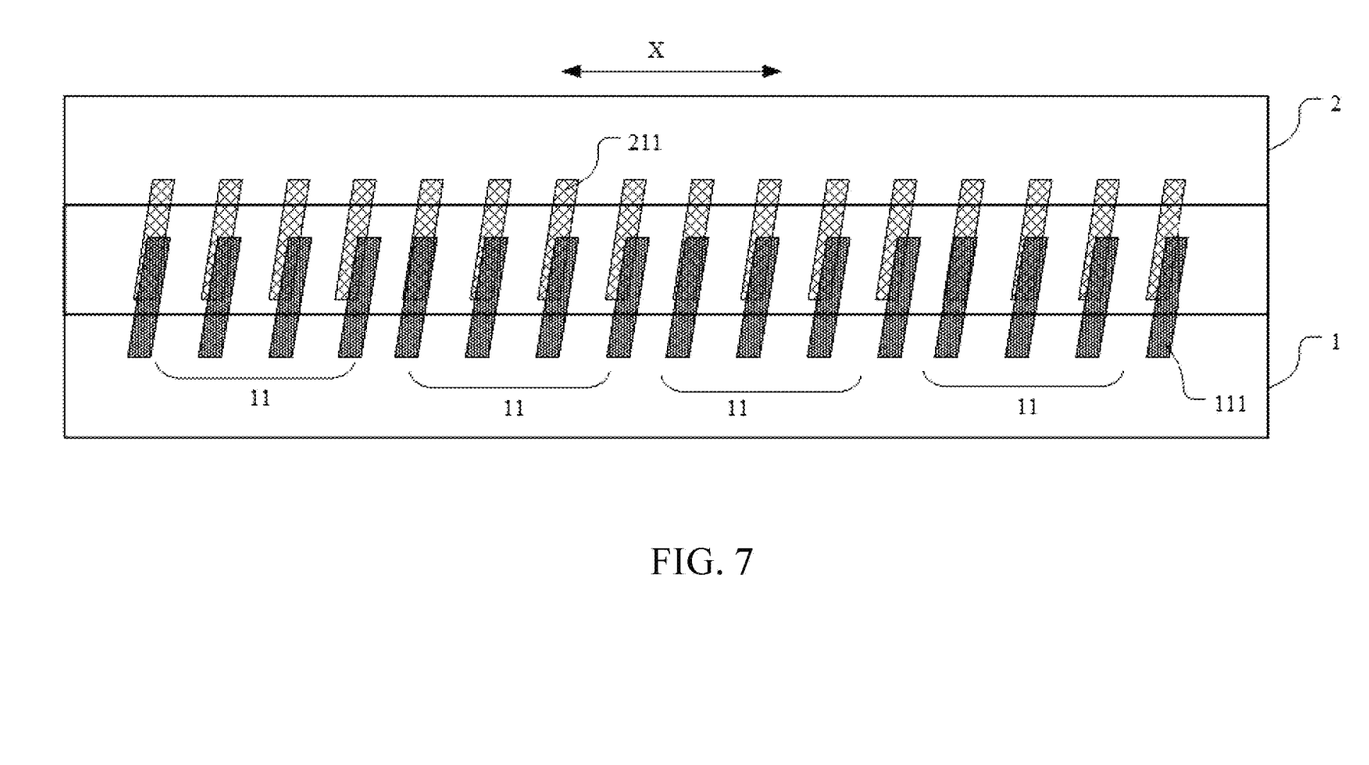
FIG. 7 is a structural schematic view of an alignment of a bearing substrate and an integrated substrate according to another exemplary embodiment of a binding method of a binding assembly of the present disclosure.

There is an alignment error when the bearing substrate 1 and the integrated substrate 2 are aligned. As shown in FIG. 7, a structural schematic view of an alignment of a bearing substrate and an integrated substrate is shown according to another exemplary embodiment of a binding method of a binding assembly of the present disclosure. As shown in FIG. 7, although there is only a small error between the bearing substrate 1 and the integrated substrate 2 in the first direction, an overlapping area of the first binding terminals 111 and the second binding terminals 211 may change greatly. In this exemplary embodiment, since both the first binding terminal 111 and the second binding terminal 211 are arranged obliquely, the bearing substrate 1 and the integrated substrate 2 may move relatively in a second direction Y to achieve a better alignment effect, wherein the second direction Y is perpendicular to the first direction X.

Figure 8:
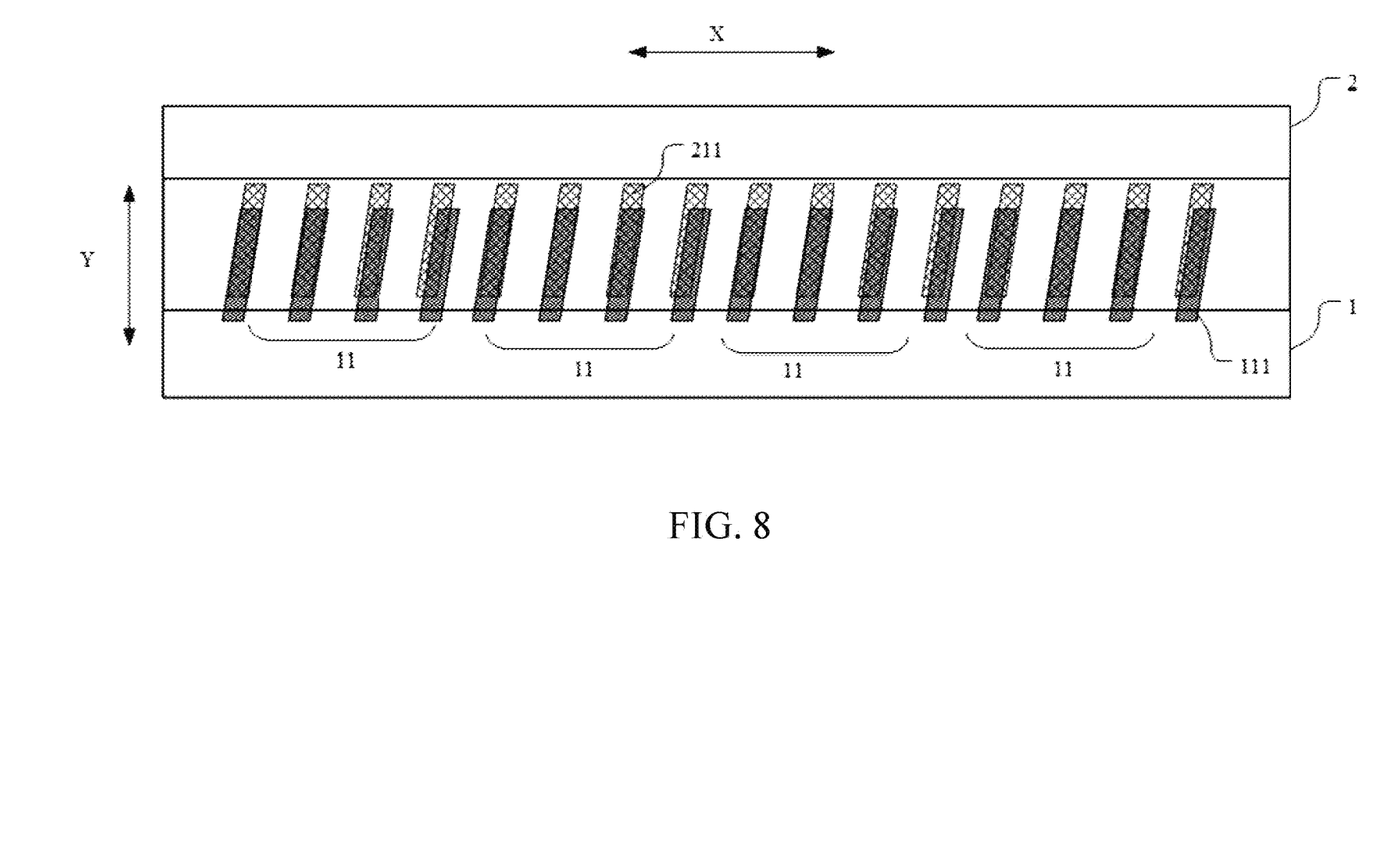
FIG. 8 is a structural schematic view of an alignment of a bearing substrate and an integrated substrate after relative movement in a second direction according to another exemplary embodiment of a binding method of a binding assembly of the present disclosure.

As shown in FIG. 8, a structural schematic view of an alignment of a bearing substrate and an integrated substrate is shown after relative movement in a second direction according to another exemplary embodiment of a binding method of a binding assembly of the present disclosure. Understandably, after the bearing substrate and the integrated substrate relatively move in the second direction, there will be a larger overlapping area between the first binding terminal 111 and the second binding terminal 211. In addition, compared to the movement of the first binding terminal 111 and the second binding terminal 211 in the first direction, the first binding terminal 111 and the second binding terminal 211 move a larger distance in the second direction, and the overlapping area between the first binding terminal 111 and the second binding terminal 211 changes slightly, so that the relative movement of the bearing substrate 1 and the integrated substrate 2 in the second direction may better control the alignment accuracy between the first binding terminal 111 and the second binding terminal 211.

In this exemplary embodiment, the binding assembly may be a display device, the bearing substrate may be a flexible display panel, and the integrated substrate may be an on-chip film. The on-chip film may also be bound with a driving chip for driving the flexible display panel. It should be understood that the bearing substrate, the integrated substrate, and the binding assembly may also have other structures. For example, the bearing substrate and the integrated substrate may be integrated circuit boards, which all fall within the protection scope of the present disclosure.

This exemplary embodiment also provides a bearing substrate that may be bound to an integrated substrate, and the bearing substrate has a thermal expansion coefficient greater than that of the integrated substrate. The integrated substrate includes a plurality of second binding terminals distributed at equal intervals in the same direction. The bearing substrate includes a plurality of first binding terminal sets distributed at equal intervals in a first direction, and each of the first binding terminal sets includes a plurality of first binding terminals distributed at equal intervals in the first direction. The plurality of first binding terminals are configured to bind with the plurality of second binding terminals one-to-one. The distance between adjacent two first binding terminal sets is smaller than the distance between adjacent two first binding terminals in the first binding terminal set, and the distance between adjacent two first binding terminals in the first binding terminal set is equal to the distance between adjacent two second binding terminals.

In this exemplary embodiment, each of the first binding terminal sets includes n first binding terminals, where n is a positive integer greater than 1. S1 is the distance between adjacent two first binding terminal sets, S2 is the distance between adjacent two first binding terminals in the first binding terminal set, a is the thermal expansion coefficient of the bearing substrate, W is a size of the first binding terminal in the first direction, and $S1=S2-a*n*(S2+W)$.

In this exemplary embodiment, the value of n is 5-35, for example, the value of n may be 5, 10, 15, 20, 25, or 30.

In this exemplary embodiment, the second binding terminal is in an elongated strip shape, and an arrangement direction of the second binding terminals is perpendicular to extending directions of the second binding terminals. The first binding terminal is in an elongated strip shape, and an arrangement direction of the first binding terminals is perpendicular to extending directions of the first binding terminals.

In this exemplary embodiment, the first binding terminal is in an elongated strip shape, a straight line where an extending direction of the first binding terminal is located forms a first acute angle with respect to a straight line in the first direction, and a value of the first acute angle is 69°-85°, for example, the value of the first acute angle may be 69°, 75°, or 85°. The second binding terminal is in an elongated strip shape, and a straight line where an extending direction of the second binding terminal is located forms a second acute angle with respect to a straight line where a distribution direction of the second binding terminals is located, and the second acute angle and the first acute angle have the same value.

In this exemplary embodiment, the bearing substrate is a flexible display panel, and the integrated substrate is an on-chip film.

The bearing substrate may be the bearing substrate shown in FIGS. 3 and 5. The structure and working principle of the bearing substrate have been described in detail above, which will not be repeated herein.

This exemplary embodiment also provides a bearing substrate including a plurality of first binding terminal sets distributed at equal intervals in the first direction, and each of the first binding terminal sets includes a plurality of first binding terminals distributed at equal intervals in the first direction. A distance between adjacent two first binding terminal sets is smaller than a distance between adjacent two first binding terminals in the first binding terminal set.

In this exemplary embodiment, each of the first binding terminal sets includes n first binding terminals, where n is a positive integer greater than 1. S1 is the distance between two adjacent first binding terminal sets, S2 is the distance between two adjacent first binding terminals in the first binding terminal set, a is a thermal expansion coefficient of the bearing substrate, W is a size of the first binding terminal in the first direction, and $S1=S2-a*n*(S2+W)$.

In this exemplary embodiment, a value of n is 5-35, for example, the value of n may be 5, 10, 15, 20, 25, or 30.

In this exemplary embodiment, the first binding terminal is in an elongated strip shape, and an arrangement direction of the first binding terminals is perpendicular to extending directions of the first binding terminals.

In this exemplary embodiment, the first binding terminal is in an elongated strip shape, and a straight line where an extending direction of the first binding terminal is located forms a first acute angle with respect to a straight line in the first direction, and a value of the first acute angle is 69°-85°, for example, the value of the first acute angle may be 69°, 75°, or 85°.

In this exemplary embodiment, the bearing substrate is a flexible display panel.

The bearing substrate may be the bearing substrate shown in FIGS. 3 and 5, and the structure and working principle of the bearing substrate have been described in detail above, which will not be repeated herein.

This exemplary embodiment also provides a binding assembly including a bearing substrate and an integrated substrate. The bearing substrate includes a plurality of first binding terminal sets. The plurality of first binding terminal sets are distributed at equal intervals in the first direction, and each of the first binding terminal sets includes a plurality of first binding terminals distributed at equal intervals in the first direction. The distance between two adjacent first binding terminal sets is smaller than the distance between two adjacent first binding terminals in the first binding terminal set. The thermal expansion coefficient of the integrated substrate is smaller than that of the bearing substrate.

The integrated substrate includes a plurality of second binding terminals. The plurality of second binding terminals are configured to bind with the plurality of first binding terminals one-to-one, and are distributed at equal intervals in the first direction.

In this exemplary embodiment, each of the first binding terminal sets includes n first binding terminals, and a value of n is 5-35, for example, the value of n may be 5, 10, 15, 20, 25, or 30.

In this exemplary embodiment, the second binding terminal is in an elongated strip shape, and an arrangement direction of the second binding terminals is perpendicular to extending directions of the second binding terminals. The first binding terminal is in an elongated strip shape, and an arrangement direction of the first binding terminals is perpendicular to extending directions of the first binding terminals.

In this exemplary embodiment, the first binding terminal is in an elongated strip shape, a straight line where an extending direction of the first binding terminal is located forms a first acute angle with respect to a straight line in the first direction, and a value of the first acute angle is 69°-85°, for example, the value of the first acute angle may be 69°, 75°, or 85°. The second binding terminal is in an elongated strip shape, and a straight line where an extending direction of the second binding terminal is located forms a second acute angle with respect to a straight line in the first direction. The second acute angle and the first acute angle have the same value.

In this exemplary embodiment, the binding assembly is a display device, the bearing substrate is a flexible display panel, and the integrated substrate is an on-chip film.

In this exemplary embodiment, the binding assembly may be a combined structure of the integrated substrate and the bearing substrate as shown in FIGS. 4, 6, and 8. The structure and working principle of the binding assembly have been described in detail above, which will not be repeated herein.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

It will be understood that the present disclosure is not limited to the precise arrangements that have been described above and shown in the drawings, and may be modified and changed without departing from the scope thereof. The scope of the present disclosure is limited only by the appended claims.

What is claimed is:

1. A bearing substrate for being bound to an integrated substrate, wherein a thermal expansion coefficient of the bearing substrate is greater than a thermal expansion coefficient of the integrated substrate, and the integrated substrate comprises a plurality of second binding terminals distributed at equal intervals in a same direction, and wherein the bearing substrate comprises:

a plurality of first binding terminal sets distributed at equal intervals in a first direction, each of the first binding terminal sets comprising a plurality of first binding terminals distributed at equal intervals in the first direction for binding with the plurality of the second binding terminals one-to-one;

wherein a distance between any adjacent two of the first binding terminal sets is smaller than a distance between adjacent two of the first binding terminals in each of the first binding terminal sets, and the distance between adjacent two of the first binding terminals in each of the first binding terminal sets is equal to a distance between adjacent two of the second binding terminals.

2. The bearing substrate of claim 1, wherein each of the first binding terminal sets includes n first binding terminals, where n is a positive integer greater than 1; and wherein S1 is the distance between adjacent two of the first binding terminal sets, S2 is the distance between adjacent two of the first binding terminals in each of the first binding terminal sets, a is the thermal expansion coefficient of the bearing substrate, W is a size of any one of the first binding terminals in the first direction, and $S1=S2-a*n*(S2+W)$.

3. The bearing substrate of claim 2, wherein a value of n is 5-35.

4. The bearing substrate of claim 1, wherein any one of the second binding terminals is in an elongated strip shape, and an arrangement direction of the second binding terminals is perpendicular to extending directions of the second binding terminals; and any one of the first binding terminals is in an elongated strip shape, and an arrangement direction of the first binding terminals is perpendicular to extending directions of the first binding terminals.

5. The bearing substrate of claim 1, wherein any one of the first binding terminals is in an elongated strip shape, a straight line where an extending direction of any one of the first binding terminals is located forms a first acute angle with respect to a straight line in the first direction, and a value of the first acute angle is 69°-85°; and any one of the second binding terminals is in an elongated strip shape, a straight line where an extending direction of any one of the second binding terminals is located forms a second acute angle with respect to a straight line where a distribution direction of the second binding terminals is located, and the second acute angle and the first acute angle have the same value.

6. The bearing substrate of claim 1, wherein the bearing substrate is a flexible display panel, and the integrated substrate is an on-chip film.

7. The bearing substrate of claim 1, wherein the bearing substrate is a flexible display panel.

8. A bearing substrate, comprising:

a plurality of first binding terminal sets distributed at equal intervals in a first direction, each of the first binding terminal sets comprising a plurality of first binding terminals distributed at equal intervals in the first direction;

wherein a distance between any adjacent two of the first binding terminal sets is smaller than a distance between adjacent two of the first binding terminals in each of the first binding terminal sets.

9. The bearing substrate of claim 8, wherein each of the first binding terminal sets includes n first binding terminals, where n is a positive integer greater than 1;

wherein S1 is the distance between adjacent two of the first binding terminal sets, S2 is the distance between adjacent two of the first binding terminals in each of the first binding terminal sets, a is a thermal expansion coefficient of the bearing substrate, W is a size of any one of the first binding terminals in the first direction, and $S1=S2-a*n*(S2+W)$.

10. The bearing substrate of claim 9, wherein a value of n is 5-35.

11. The bearing substrate of claim 8, wherein any one of the first binding terminals is in an elongated strip shape, and an arrangement direction of the first binding terminals is perpendicular to extending directions of the first binding terminals.

12. The bearing substrate of claim 8, wherein any one of the first binding terminals is in an elongated strip shape, a straight line where an extending direction of any one of the first binding terminals is located forms a first acute angle with respect to a straight line in the first direction, and a value of the first acute angle is 69°-85°.

13. A binding assembly, comprising:

a bearing substrate, comprising:

a plurality of first binding terminal sets distributed at equal intervals in a first direction, each of the first binding terminal sets comprising a plurality of first binding terminals distributed at equal intervals in the first direction, wherein a distance between any adjacent two of the first binding terminal sets is smaller than a distance between adjacent two of the first binding terminals in each of the first binding terminal sets;

an integrated substrate having a thermal expansion coefficient smaller than a thermal expansion coefficient of the bearing substrate, and comprising a plurality of second binding terminals for binding with the plurality of first binding terminals one-to-one, the plurality of second binding terminals being distributed at equal intervals in the first direction.

14. The binding assembly of claim 13, wherein each of the first binding terminal sets comprises n first binding terminals, and a value of n is 5-35.

15. The binding assembly of claim 13, wherein any one of the second binding terminals is in an elongated strip shape, and an arrangement direction of the second binding terminals is perpendicular to extending directions of the second binding terminals; and any one of the first binding terminals is in an elongated strip shape, and an arrangement direction of the first binding terminals is perpendicular to extending directions of the first binding terminals.

16. The binding assembly of claim 13, wherein any one of the first binding terminals is in an elongated strip shape, a straight line where an extending direction of any one of the first binding terminals is located forms a first acute angle with respect to a straight line in the first direction, and a value of the first acute angle is 69°-85°; and any one of the second binding terminals is in an elongated strip shape, a straight line where an extending direction of any one of the second binding terminals forms a second acute angle with respect to a straight line in the first direction, and the second acute angle and the first acute angle have the same value.

17. The binding assembly of claim 13, wherein the binding assembly is a display device, the bearing substrate is a flexible display panel, and the integrated substrate is an on-chip film.

* * * * *